United States Patent [19]

Toyoda

[11] Patent Number: 4,802,131
[45] Date of Patent: Jan. 31, 1989

[54] SEMICONDUCTOR MEMORY DEVICE HAVING PULSE WIDTH CONTROL CIRCUIT

[75] Inventor: Kazuhiro Toyoda, Yokohama, Japan

[73] Assignee: Fujitsu Limited, Kawasaki, Japan

[21] Appl. No.: 152,997

[22] Filed: Feb. 8, 1988

Related U.S. Application Data

[63] Continuation of Ser. No. 737,465, May 24, 1985, abandoned.

[30] Foreign Application Priority Data

May 30, 1984 [JP] Japan .................. 59-108516

[51] Int. Cl.4 .................. G11C 7/00; G11C 8/00
[52] U.S. Cl. .................. 365/230; 365/233; 365/189
[58] Field of Search .................. 365/230, 233, 189

[56] References Cited

U.S. PATENT DOCUMENTS

| 4,272,832 | 6/1981 | Ito | 365/233 X |
| 4,298,961 | 11/1981 | Hotta et al. | 365/189 X |
| 4,337,523 | 6/1982 | Hotta et al. | 365/233 X |
| 4,337,525 | 6/1982 | Akatsuka | 365/233 |
| 4,355,377 | 10/1982 | Sud et al. | 365/190 X |
| 4,479,200 | 10/1984 | Sato et al. | 365/179 X |
| 4,480,321 | 10/1984 | Aoyama | 365/200 X |
| 4,573,147 | 2/1986 | Aoyama et al. | 365/230 |

OTHER PUBLICATIONS

European Search Report, EP 85303838, The Hague, 10-21-86.
Patents Abstract of Japan, vol. 8, No. 175 (P-321) [1712], Dec. 15, 1984.
Patents Abstracts of Japan, vol. 1, No. 103, Sep. 13, 1977.

Primary Examiner—Stuart N. Hecker
Assistant Examiner—Alyssa H. Bowler
Attorney, Agent, or Firm—Staas & Halsey

[57] ABSTRACT

A semiconductor memory device including an address change detection circuit and a pulse width control circuit. The pulse width control circuit inhibits the passage of write enable signals having a short pulse width for a predetermined period from the change of the address. After the predetermined period, the control operation in the pulse width control circuit is overridden. Therefore, the write cycle time can be kept down.

18 Claims, 10 Drawing Sheets

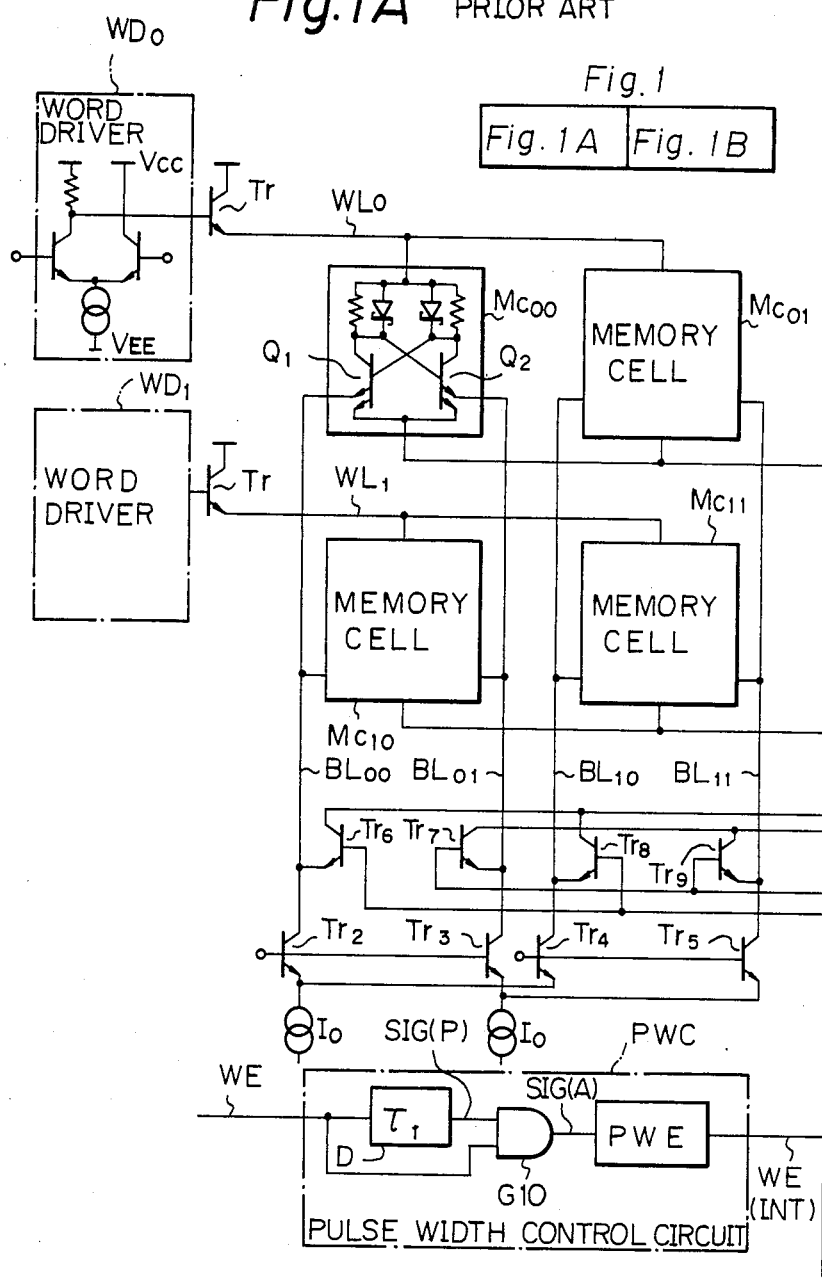

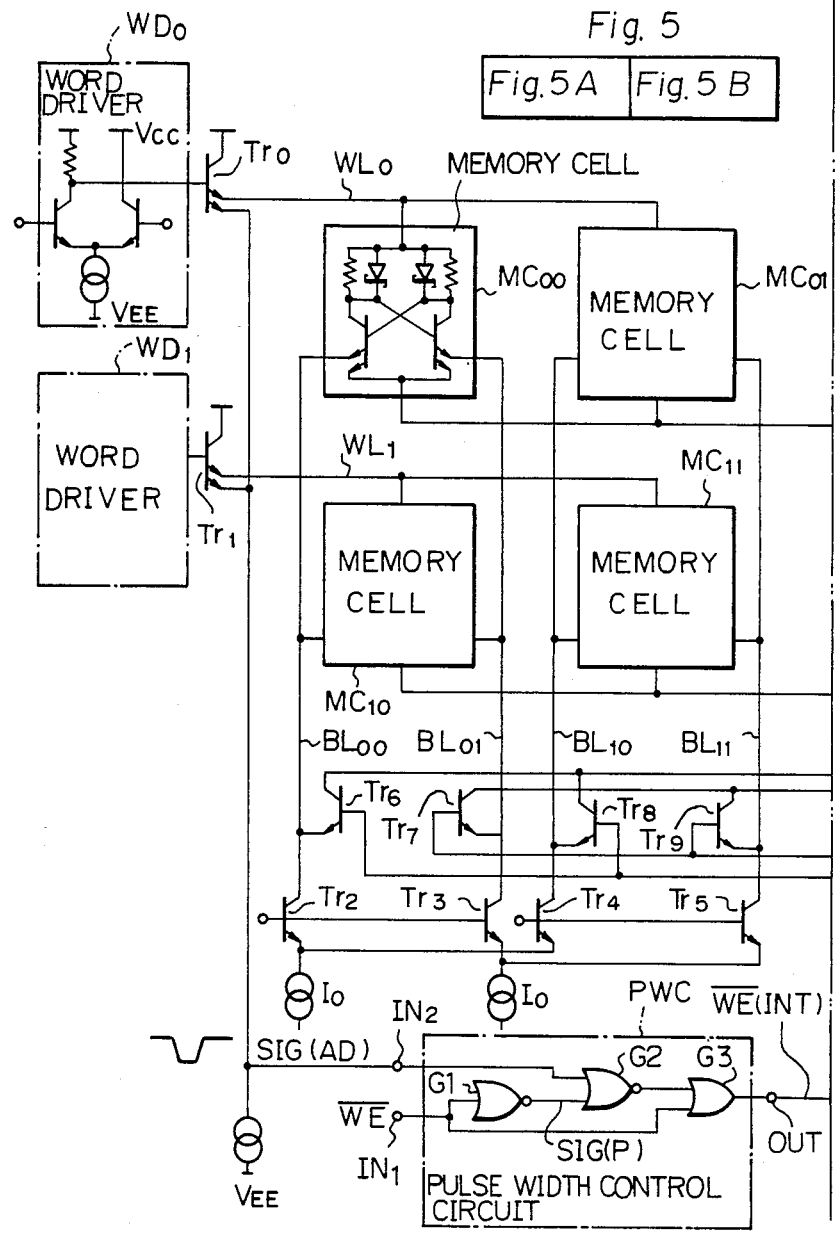

Fig. 11
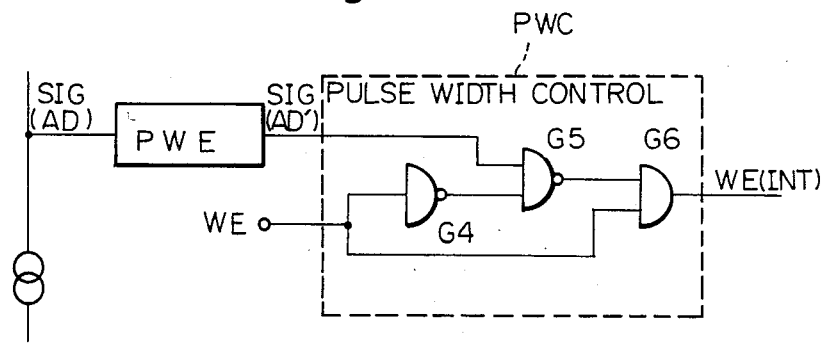
Fig. 12A
SIG(AD):HIGH
Fig. 12B
SIG(AD):LOW
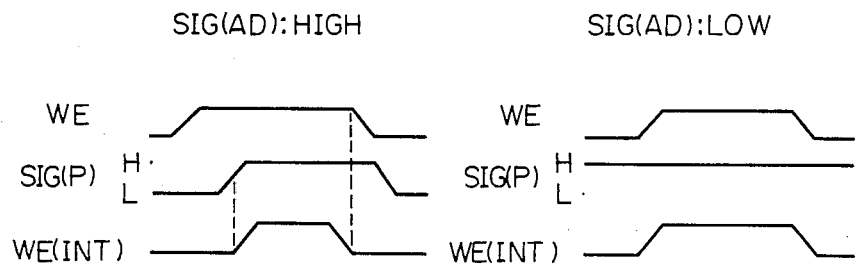
Fig. 13
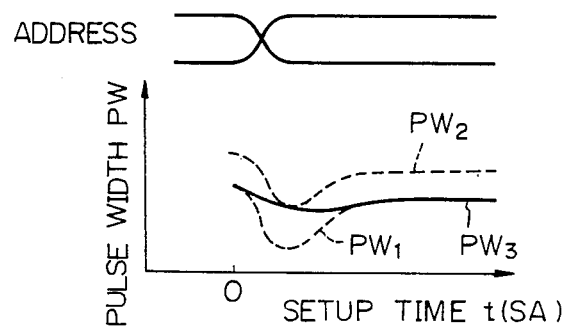

SEMICONDUCTOR MEMORY DEVICE HAVING PULSE WIDTH CONTROL CIRCUIT

This is a continuation of co-pending application Ser. No. 737,465 filed on May 24, 1985 now abandoned.

BACKGROUND OF THE INVENTION

Field of the Invention

The present invention relates to a memory device using semiconductors, particularly bipolar type semiconductors, more particularly a semiconductor memory device having a pulse width control circuit for preventing erroneous operation in a write circuit.

A semiconductor memory device usually cannot effect a write operation unless the pulse width of the write enable signal is greater than a certain magnitude. One of the exceptions is just after a change of address. At such times, the write operation may be effected by even a write enable signal having a relatively short pulse width. Consequently, however, an erroneous write operation may be caused just after a change of address due to noise.

To prevent such erroneous write operations, Japanese Unexamined Patent Publication (Kokai) No. 53-114651 discloses a pulse width control circuit permitting the passage of a write enable signal having a pulse width greater than a predetermined pulse width and inhibiting the passage of that having less than the predetermined pulse width.

This pulse width control circuit can prevent erroneous write operations due to noise. However, the circuit requires a certain processing time and a minimum pulse width of the write enable signal to effect the write operation. As a result, the write cycle time is disadvantageously increased.

SUMMARY OF THE INVENTION

Accordingly, it is an object of the present invention to provide a semiconductor memory device wherein the erroneous write operations due to noise can be prevented without increasing the write cycle time.

According to a fundamental aspect of the present invention, there is provided a semiconductor memory device including write signal generation means for obtaining the logical product of a write signal and the delayed signal thereof and generating an internal write signal, the write signal generation means being in operation only during a predetermined period from detection of an address change.

According to another aspect of the present invention, there is provided a semiconductor memory device including address change detecting means for detecting a change of address of memory cells and delivering an output signal for a predetermined period upon the detection of the change of address; and pulse width control means for inhibiting the passage of only write enable signals having a pulse width smaller than a predetermined pulse width during the predetermined period.

BRIEF DESCRIPTION OF THE DRAWINGS

Examples of a device in accordance with the present invention will now be described with reference to the accompanying drawings, in which:

FIGS. 1A and 1B are the left and right halves of a circuit diagram of a semiconductor memory device in the prior art, respectively;

FIGS. 5A and 5B are the left and right halves of a circuit diagram of a semiconductor memory device according to one embodiment of the present invention, respectively;

FIG. 11 shows a modification the present invention;

FIGS. 12A and 12B show signal waveforms in a pulse width control circuit of FIG. 11; and FIG. 13 shows the relationship between a setup time and pulse width of a write enable signal in accordance with the present invention.

DESCRIPTION OF THE PREFERRED EMBODIMENTS

For a better understanding of the preferred embodiments, the problems in the prior art will first be explained with reference to FIGS. 1 to 4.

Figure 1B:
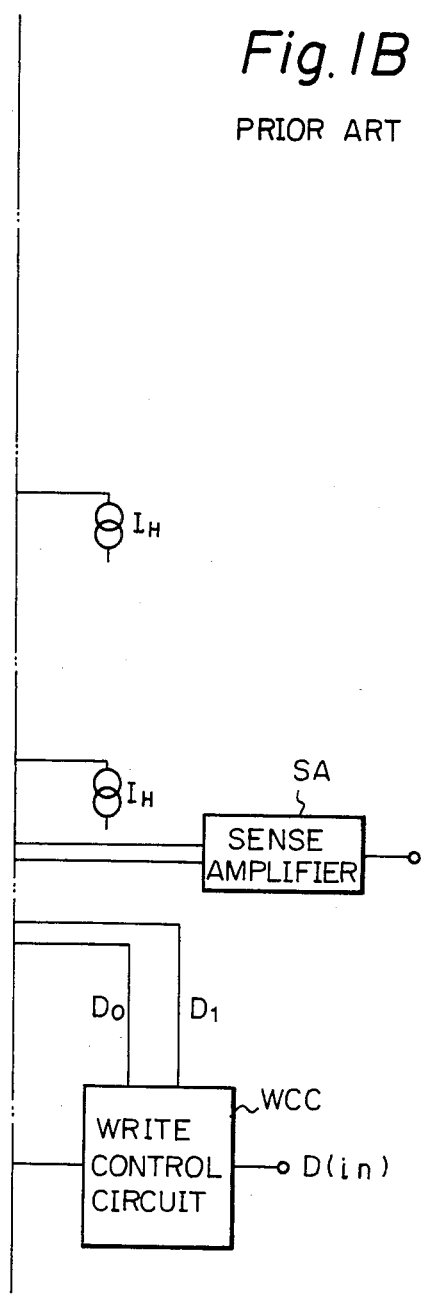

FIG. 1 shows a semiconductor memory device of the prior art. In FIG. 1, $MC_{00}$ through $MC_{11}$ are memory cells of an emitter-coupled logic (ECL) type, $WL_0$ and $WL_1$ are word lines, $Tr_2$ through $Tr_5$ are bit-line selection transistors, $Tr_6$ through $Tr_9$ are read/write control transistors, SA is a sense amplifier, WCC is a write control circuit, PWC is a pulse-width control circuit, and $I_H$ and $I_O$ are current sources. Each of memory cells $MC_{00}$ through $MC_{11}$ includes two multi-emitter transistors Q1 and Q2, as typically shown by $MC_{00}$.

In a write operation on the memory cell $MC_{00}$, the word driver $WD_0$ and bit line selection transistors $Tr_2$ and $Tr_3$ are used to address the memory cell $MC_{00}$. A write enable signal WE is then supplied to the write control circuit. One of the control signals $D_0$ and $D_1$ become "0" and the other "1" in accordance with the write data D(in). Consequently the write operation of the memory cell $MC_{00}$ is effected.

Figure 2:
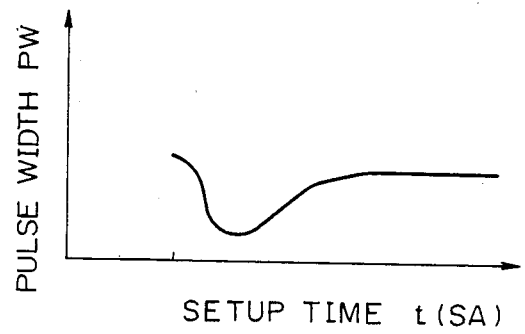
FIG. 2 shows the relationship between a setup time and pulse width of a write enable signal.

In this write operation, the write enable signal is applied after a setup time t(SA) from the change of address. The write enable signal must have a pulse width greater than a certain magnitude. This certain magnitude which is necessary for the write operation varies in accordance with the setup time t(SA). FIG. 2 shows the relationship between the setup time t(SA) of the write enable signal and the minimum necessary pulse width. In FIG. 2, the ordinate represents the minimum necessary pulse width PW, and the abscissa represents the setup time t(SA). As clear from FIG. 2, a write operation is possible just after the change of address even with short pulse width. As the setup time t(SA) becomes longer, however, the write operation cannot be effected unless the pulse width is greater than a certain magnitude.

Figure 3:
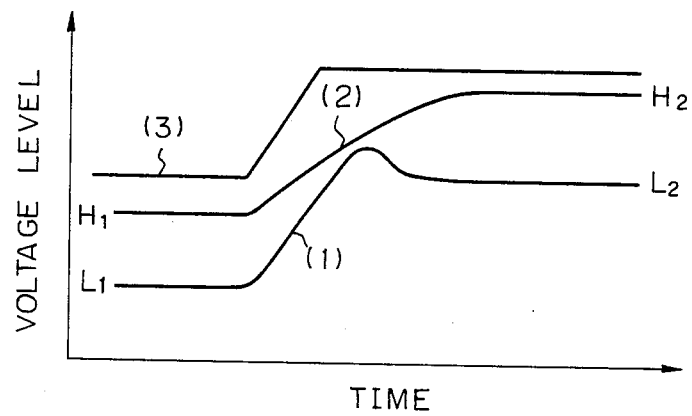
FIG. 3 shows voltage waveforms in a memory cell at a change of address.

This reason is described below. Assume that the transistor Q1 of the memory cell $MC_{00}$ is in the on state and that the transistor Q2 is in the off state. FIG. 3 thus shows the variations of the collector voltage of the these transistors Q1 and Q2 before and after the change of address. In FIG. 3, (1) represents the collector voltage of the transistor Q1, (2) the collector voltage of the transistor Q2, and (3) the voltage of the word line $WL_0$. When the word line voltage (3) rises up due to the address selection, the collector voltage (2) rises up gradually from $H_1$ to $H_2$. On the other hand, the collector voltage (1) of the transistor Q1 rises up rapidly from $L_1$ in an "overdamping" state and then stabilizes at $L_2$. As clear from FIG. 3, just after the change of address, the voltage difference between the collector voltages (1) and (2) becomes very small. Therefore, a write enable signal having a short pulse width can readily cause the on-off states of the transistors Q1 and Q2 to invert and, thus, a write operation to be effected.

Since the write operation can be effected by means of a write enable signal having a short pulse width just after the change of address, it can also be effected by noise, resulting in an erroneous write operation.

To solve this problem, as mentioned before, there has been proposed in Japanese Unexamined Patent Publication (Kokai) No. 53-114651 a pulse width control circuit which inhibits passage of write enable signals with pulse widths smaller than a certain magnitude, permitting passage of only signals with pulse widths more than that.

Such a pulse width control circuit PWC is shown at the center bottom of FIG. 1. The circuit includes a delay element D, and AND gate G10, and a pulse width extension circuit PWE which extends the pulse width of the output of the AND gate G10 to a certain magnitude. In this pulse width control circuit PWC, the output of the AND gate G10 appears only when input signals are simultaneously applied on its two input terminals. Accordingly, when the pulse width of the write enable signal WE is smaller than the delay time of the delay element D, the passage of the write enable signal is inhibited by the AND gate G10.

Figure 4:
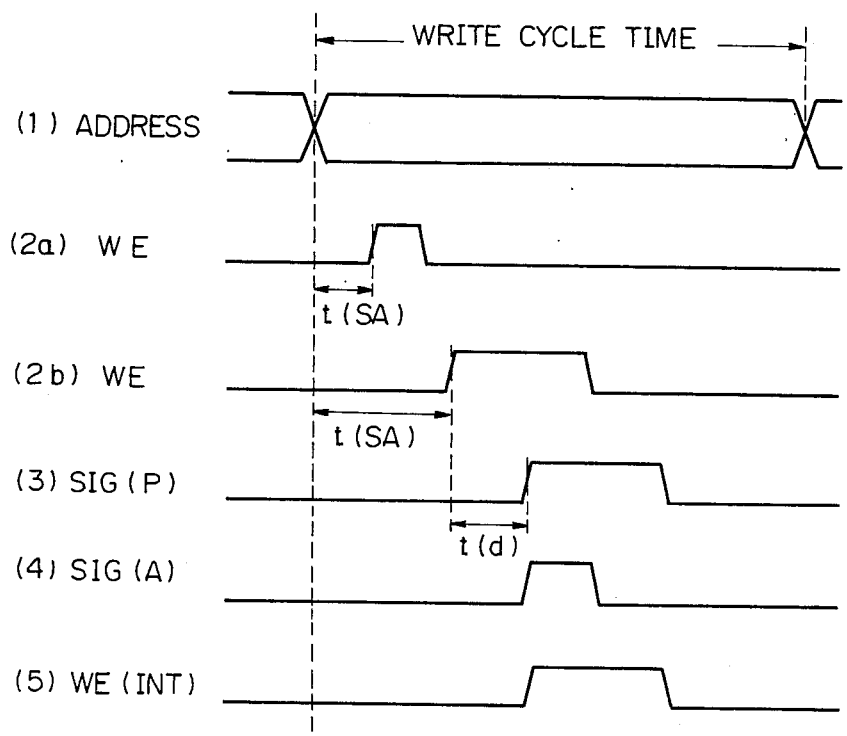
FIG. 4 shows a signal wave-form in a pulse width control circuit of FIG. 1.

FIG. 4 shows signal waveforms at individual points of the pulse width control circuit PWC of FIG. 1. In FIG. 4, (1) represents the state of change of the address, (2a) a write enable signal having a short pulse width, (2b) a write enable signal having a long pulse width, (3) an output signal of the delay element D, (4) an output signal of the AND gate G10, and (5) an output signal of the pulse width extension circuit PWE as an internal write enable signal WE(INT) whose pulse width is extended to the pulse width of original write enable signal WE. As clear from FIG. 4, when the pulse width of the write enable signal WE is short (FIG. 4, waveform (20)), no output signal appears at the output of the AND gate G10, and therefore, no internal write enable signal WE(INT) appears. When the pulse width is long (FIG. 4, waveform (26)), however, an internal write enable signal WE(INT) is delivered from the AND gate G10, whereby the write operation is effected.

The above-described circuit PWC may be used to prevent erroneous write operations caused by noise just after the change of address. However, the circuit requires the delay time caused at the delay element D in addition to a minimum pulse duration. This results in an increased write cycle time.

Figure 5B:
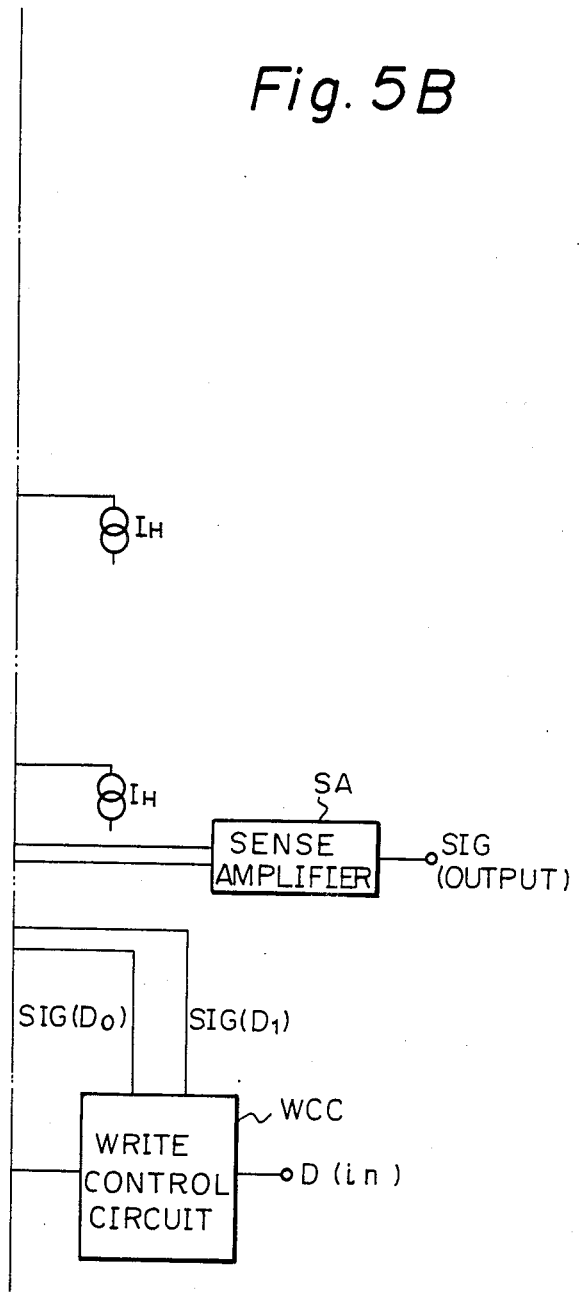

A preferred embodiment of the present invention will now be explained with reference to FIG. 5 to FIG. 9. FIG. 5 illustrates a semiconductor memory device of an embodiment of the present invention. In FIG. 5, $MC_{00}$, $MC_{01}$, $MC_{10}$, and $MC_{11}$ are memory cells of the ECL type, $WL_0$ and $WL_1$ are word lines, and $BL_{00}$, $BL_{01}$, $BL_{10}$, and $BL_{11}$ are bit lines. The word lines $WL_0$ and $WL_1$ are connected to one of the emitters of the multi-emitter type transistors $Tr_0$ and $Tr_1$, respectively. $WD_0$ and $WD_1$ are word drivers which receive input signals from an address decoder (not shown in FIG. 5).

The bit lines $BL_{00}$, $BL_{01}$, $BL_{10}$, and $BL_{11}$ are connected to current sources via the bit line selection transistors $Tr_2$, $Tr_3$, $Tr_4$, and $Tr_5$, respectively. Furthermore, the bit lines $BL_{00}$, $BL_{01}$, $BL_{10}$, and $BL_{11}$ are connected to a sense amplifier SA via the transistors $Tr_6$, $Tr_7$, $Tr_8$, and $Tr_9$, respectively. The bases of the transistors $Tr_6$ through $Tr_9$ are connected to a write control circuit WCC. These transistors $Tr_6$ through $Tr_9$ are driven by the control signals $D_0$ and $D_1$ delivered from the write control circuit WCC.

The write control circuit WCC generates the control signals $D_0$ and $D_1$, one being the logical level "1" and the other "0", in accordance with write data D(in). A pulse width control circuit PWC supplies this write control circuit WCC with an internal write enable signal $\overline{WE}$(INT).

The pulse width control circuit PWC operates so as to allow the passage of a write enable signal $\overline{WE}$ applied externally only when the signal $\overline{WE}$ has pulse width greater than a predetermined magnitude. Furthermore, this circuit PWC itself selects whether to enable or inhibit such an operation of its own depending upon the address change.

At the bottom of FIG. 5 is shown the pulse width control circuit PWC, including, for example, an inverter G1, NOR gate G2, and OR gate G3, which operates in the manner of a negative logic. In this circuit PWC, the write enable signal $\overline{WE}$ is directly applied to one input terminal of the OR gate G3 and is applied to the other input terminal of the OR gate G3 after being delayed by the inverter G1 and the NOR gate G2. Accordingly, a write enable signal $\overline{WE}$ whose pulse width is shorter than the delay time caused at the inverter G1 and the NOR gate G2 is ignored. Therefore, no internal write enable signal $\overline{WE}$(INT) appears at the output of the pulse width control circuit PWC.

The other input terminal of the NOR gate G2 is connected to the other emitters of the multi-emitter transistors $Tr_0$ and $Tr_1$. Therefore, when a change of memory address is effected, it receives a signal AD of a logical level "1" (Low level) for a predetermined period from the time of the change. Consequently, the NOR gate G2 is opened for the predetermined period after the change, whereby pulse width control of the write enable signal $\overline{WE}$ is effected.

That is, when the pulse width of the write enable signal $\overline{WE}$ is smaller than the delay time caused at the inverter G1 and the NOR gate G2, the passage of the write enable signal $\overline{WE}$ is inhibited by the OR gate G3. Therefore, no internal write enable signal $\overline{WE}$(INT) appears. On the contrary, when the pulse width of the write enable signal $\overline{WE}$ is greater than the delay time, an internal write enable signal $\overline{WE}$(INT) having a pulse width corresponding to the differential value is applied to the write control circuit WCC.

After the predetermined period passes from the change, the signal AD becomes the logical level "0", (High level) whereupon the NOR gate G2 is closed and its output is kept at the logical level "1". Accordingly, the write enable signal $\overline{WE}$ is directly delivered as the internal write enable signal $\overline{WE}$(INT).

Figure 6:
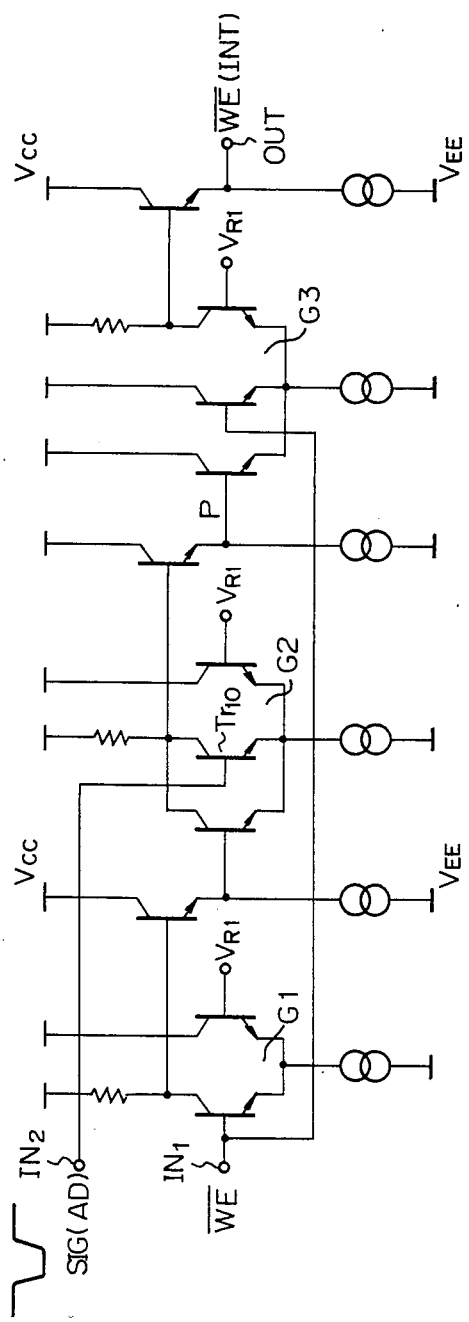
FIG. 6 is a circuit diagram of a pulse width control circuit in FIG. 5.

FIG. 6 shows an embodiment of the pulse width control circuit PWC in FIG. 5, constituted in the form of an ECL. This circuit corresponds exactly to that shown in FIG. 5, therefore, operates in the manner of a negative logic. In FIG. 6, $IN_1$ is an input terminal for the write enable signal $\overline{WE}$, $IN_2$ is an input terminal for the signal AD, OUT is an output terminal where the internal write enable signal $\overline{WE}(INT)$ appears, and $V_{R1}$ is a reference voltage.

The mode of operation of the above-described embodiment will now be described.

Figure 7:
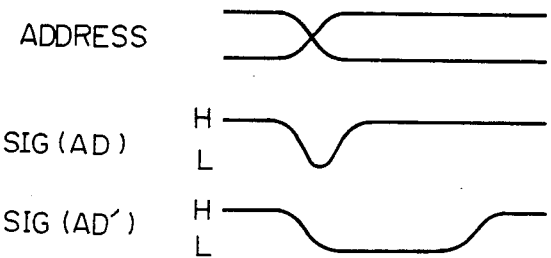
FIG. 7, FIGS. 8A and 8B, and FIG. 9 show signal waveforms in the device of FIG. 5.
Figures 8A, 8B:
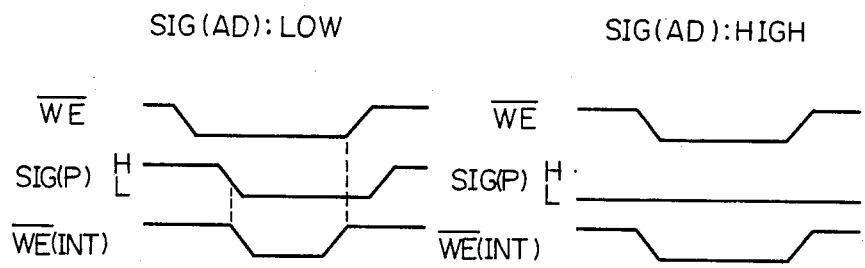

As shown in FIG. 7, when the address of the memory is changed, the signal AD becomes the "L" level for a certain period due to the time lag between the rise and fall of the outputs of the transistors $Tr_0$ and $Tr_1$. When the signal AD is the "L" level, as shown in FIG. 8A, pulse width control is effected. That is, when the write enable signal $\overline{WE}$ is applied to the input terminal $IN_1$, a signal P delayed with respect to the signal $\overline{WE}$ is generated. As a result, a logical product signal of this delayed signal P and the write enable signal $\overline{WE}$ is delivered from the output terminal OUT as the internal write enable signal $\overline{WE}(INT)$. It is also possible to extend the pulse width of this logical product signal by integration and adopt it as the internal write enable signal $\overline{WE}(INT)$. After a certain time passes from the change of the address, the signal AD becomes the "H" level. Therefore, as shown in FIG. 8B, no pulse width control is effected. That is, when the signal AD becomes the "H" level, the transistor $Tr_{10}$ in FIG. 6 turns on, so the signal P is always the "L" level. Consequently, the input write enable signal $\overline{WE}$ is directly delivered as the internal write enable signal $\overline{WE}(INT)$.

Figure 9:
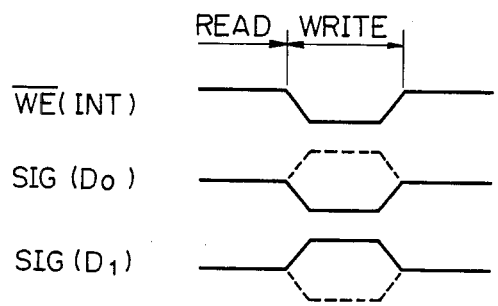

When the internal write enable signal obtained as described above is applied to the write control circuit WCC, the control signals $D_0$ and $D_1$ of FIG. 9 having inverse logics are formed in accordance with the write data D(in). These control signals $D_0$ and $D_1$ are applied to the bases of the transistors $Tr_6$ through $Tr_9$. By this, the data D(in) is written into the addressed memory cell.

Although a preferred embodiment has been described heretofore, various modifications and alterations are possible within the scope of the present invention.

Figure 10:
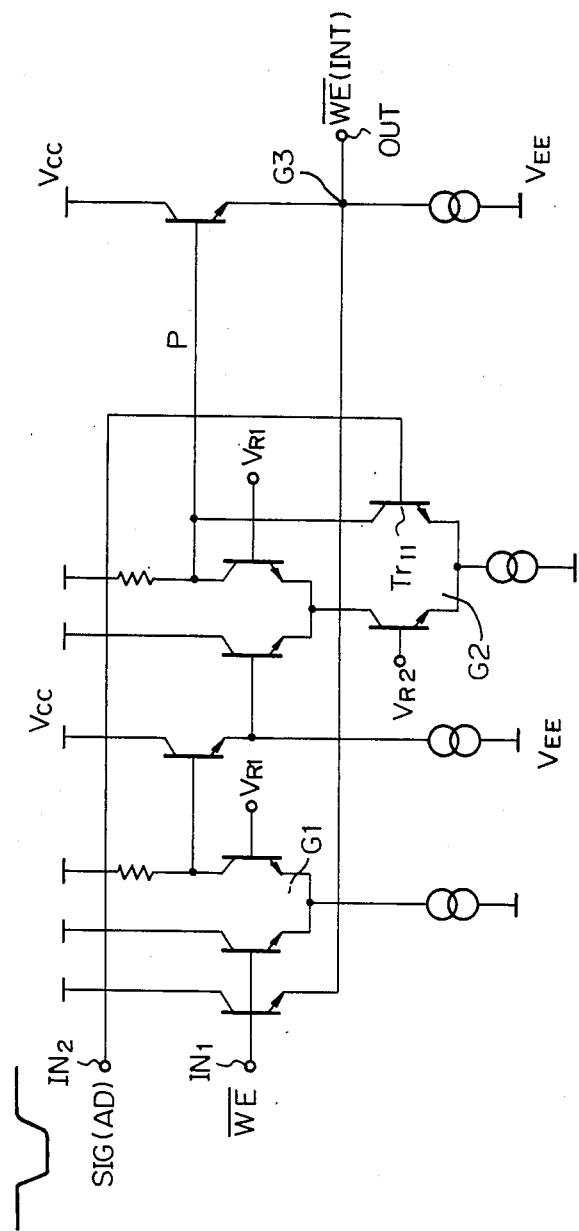
FIG. 10 shows a modification of the pulse width control circuit in FIG. 5.

For example, the pulse width control circuit PWC is not limited to the constitution described above. FIG. 10 shows another embodiment of the pulse width control circuit PWC. This embodiment is somewhat more simplified compared with circuit of FIG. 6, but is also constituted in the form of an ECL, operating in the manner of a negative logic. $IN_1$, $IN_2$, and OUT are terminals the same as those shown in FIG. 6, and $VR_1$ and $VR_2$ are reference voltages. In the circuit of FIG. 10, when the signal AD becomes the "H" level, the transistor $Tr_{11}$ turns on and the delayed signal P is kept at the "L" level. As a result, the write enable signal $\overline{WE}$ is directly output as the internal write enable signal $\overline{WE}(INT)$.

Although the above-described examples referred to ECL's, transistor-transistor logic (TTL) is of course also possible.

Furthermore, the pulse width control circuit PWC may be constituted by a positive logic circuit instead of a negative logic circuit described above. FIG. 11 shows such a circuit PWC, including an inverter G4, and NAND gate G5, and an AND gate G6. FIGS. 12A and 12B show a write enable signal $\overline{WE}$, an internal write enable signal $\overline{WE}(INT)$, and a delayed signal P in the circuit PWC of FIG. 11, FIG. 12A showing the case just after the change of address where pulse width control is effected and FIG. 12B showing the case after a certain time elapses from the change of address where pulse width control is not effected.

Furthermore, in the above description, the signal AD taken out from the emitters of the transistors $Tr_0$ and $Tr_1$ was directly supplied to the pulse width control circuit PWC. In another modification, however, the signal may be supplied via the circuit PWE of FIG. 11, which extends the duration of the signal AD. By this circuit, as shown in FIG. 7, a signal AD' with an arbitrarily defined duration can be obtained.

Further, the above description has been made with reference to four memory cells. In practice, however, a large number of memory cells are arranged in the form of a matrix.

As described heretofore, according to the present invention, pulse width control of the write enable signal is possible only in a predetermined period just after the change of address. As a result, problems such as the pulse width of the write enable signal becoming too large or the write cycle time becoming too long are eliminated.

As shown by $PW_1$ in FIG. 13, in the prior art, the write operation is enabled even by a write enable signal having a short pulse width just after the change of address. Consequently, erroneous operations may readily occur. If pulse width control is always effected so as to prevent such erroneous operations, the continuous delay as shown by $PW_2$ in FIG. 13 increases the pulse width of the write enable signal, i.e., increases the write cycle time.

On the other hand, according to the present invention as shown by $PW_3$ in FIG. 13, these problems are eliminated since pulse width control is effected only in a predetermined period from the change of address which is the very first portion of each address cycle. Therefore, the delay time due to the pulse width control circuit function does not affect to the whole cycle time. During this pulse width control, a write operation cannot be effected by a write enable signal having a short pulse width. Therefore, no erroneous write operation due to noise occurs.

I claim:

1. A semiconductor memory device comprising:
   an address change detecting means for detecting change in the address of a memory cell in a memory to be written, and for delivering a detection output signal for a predetermined period upon the detection of each said change of address;
   a write enable input terminal for receiving a write enable signal; and
   a pulse width control means, operatively connected to the address change detection means to receive the detection output signal and operatively connected to the write enable input terminal to receive the write enable signal, for outputting an internal write enable signal in response to said received write enable signal during said predetermined period when said received write enable signal has a pulse width longer than a predetermined pulse width and blocking said internal write enable signal when said received write enable signal has a pulse width less than said predetermined pulse width and outputting said internal write enable signal during a period outside said predetermined period when said received write enable signal has a pulse width of any size.

2. A semiconductor memory device according to claim 1, wherein said pulse width control means comprises:
- a delay element, operatively connected to receive each said write enabling signal, for delaying each said write enable signal;
- a first gate circuit, operatively connected to said delay element and said address change detecting means to receive the delayed write enable signal from the delay element and the detection output signal from the address change detecting means at first and second input terminals, for controlling the passage of each respective delayed write enable signal from the delay element in accordance with the output signal of the address change detecting means; and
- a second gate circuit, having first and second input terminals and operatively connected to the first gate circuit to receive the output signal of the first gate circuit at said first input terminal and receiving the write enable signals at said second input terminal, for controlling said passage of said write enable signals in accordance with the output signal of the first gate circuit.

3. The device of claim 2, wherein said second gate circuit outputs, during said predetermined period, each said internal write enable signal corresponding to each said write signal which occurs during said predetermined period and which has a pulse width greater than said predetermined pulse width, and outputs as each respective write enable signal occurring outside said predetermined period.

4. A semiconductor memory device according to claim 2, wherein said pulse width control means comprises a negative logic circuit.

5. A semiconductor memory device according to claim 4, wherein the delay element is an inverter, the first gate circuit is a NOR gate, and the second gate circuit is an OR gate.

6. A semiconductor memory device according to claim 2, wherein said pulse width control means comprises a positive logic circuit.

7. A semiconductor memory device according to claim 6, wherein the delay element is an inverter, the first gate circuit is a NAND gate, and the second gate circuit is an AND gate.

8. A semiconductor memory device according to claim 1, wherein
said address change detecting means comprises a plurality of two-emitter transistors each having a first emitter connected to a respective word line of said memory, a second emitter connected to a current source, and a base connected to a respective word driver,
the second emitters of all the two-emitter transistors are commonly connected, and a detection output signal of the address change detecting means is taken out from the common connection.

9. A semiconductor memory device according to claim 8, wherein said address change detecting means further comprises a pulse width extension circuit for prolonging a duration time of the output signal taken out from the common connection.

10. A semiconductor memory device comprising:
an address change detecting means for detecting change in the address of a memory cell in a memory to be written, and for delivering a detection output signal for a predetermined period upon the detection of each said change of address; and
pulse width control means operatively connected to the address change detecting means to receive the detection output signal, for receiving write enable signals at an input terminal and for outputting an internal write enable signal in response to each said write enable signal having a pulse width of at least a predetermined pulse width and blocking each said write enable signal having a pulse width less than said predetermined pulse width during said predetermined period upon the reception of the detection output signal, said write enable signal input to the pulse width control means passing through said pulse width control means and output as the internal write enable signal after the lapse of said predetermined period upon the reception of the detection output signal.

11. A semiconductor memory device, comprising:
- an address change detecting mean for detecting change in the address of a memory cell in a memory to be written, and for delivering a detection output signal for a predetermined period upon the detection of each said change of address; and
- a pulse width control means, operatively connected to the address change detection means to receive the detection output, for receiving write enable signals at an input terminal and for outputting an internal write enable signal corresponding to each said write enable signal having a pulse width of at least a predetermined pulse width and occurring during said predetermined period, blocking each said write enable signal having a pulse width less than said predetermined pulse width and occurring during said predetermined period, comprising:
  - a delay element, operatively connected to receive each said write enabling signal, for delaying each said write enable signal;
  - a first gate circuit, operatively connected to said delay element and said address change detecting means to receive the delayed write enable signal from the delay element and the detection output signal from the address change detecting means at first and second input terminals, for controlling the passage of each respective delayed write enable signal from the delay element in accordance with the output signal of the address change detecting means; and
  - a second gate circuit, having first and second input terminals and operatively connected to the first gate circuit to receive the output signal of the first gate circuit at said first input terminal and receiving the write enable signals at said second input terminal, for controlling said passage of said write enable signals in accordance with the output signal of the first gate circuit.

12. A semiconductor memory device according to claim 11, wherein said pulse width control means comprises a negative logic circuit.

13. A semiconductor memory device according to claim 12, wherein the delay element is an inverter, the first gate circuit is a NOR gate, and the second gate circuit is an OR gate.

14. A semiconductor memory device according to claim 11, wherein said pulse width control means comprises a positive logic circuit.

15. A semiconductor memory device according to claim 14, wherein the delay element is an inverter, the first gate circuit is a NAND gate, and the second gate circuit is an AND gate.

16. A semiconductor memory device according to claim 11, wherein said second gate circuit outputs, during said predetermined period, each said internal write enable signal corresponding to each said write signal which occurs during said predetermined period and which has a pulse width greater than said predetermined pulse width, and outputs as each respective write enable signal occurring outside said predetermined period.

17. A semiconductor memory device, comprising:

an address change detecting means for detecting change in the address of a memory cell in a memory to be written, and for delivering a detection output signal for a predetermined period upon the detection of each said change of address, said address change detecting means including a plurality of two-emitter transistors each having a first emitter connected to a respective word line of said memory, a second emitter connected to a current source, and a base connected to a respective word driver, the second emitters of all the two-emitter transistors being commonly connected, and a detection output signal of the address change detecting means being taken out from the common connection; and a pulse width control means, operatively connected to the address change detection means to receive the detection output, for receiving write enable signals at an input terminal and for outputting an internal write enable signal corresponding to each said write enable signal having a pulse width of at least a predetermined pulse width and occurring during said predetermined period, blocking each said write enable signal having a pulse width less than said predetermined pulse width and occurring during said predetermined period.

18. A semiconductor memory device according to claim 17, wherein said address change detecting means further comprises a pulse width extension circuit for prolonging a duration time of the output signal taken out from the common connection.

* * * * *